(12) United States Patent
Parent

(10) Patent No.: US 10,014,484 B2
(45) Date of Patent: Jul. 3, 2018

(54) PHOTOVOLTAIC TEXTILES

(71) Applicant: Donald G. Parent, Windham, ME (US)

(72) Inventor: Donald G. Parent, Windham, ME (US)

(*) Notice: Subject to any disclaimer, the term of this patent is extended or adjusted under 35 U.S.C. 154(b) by 31 days.

(21) Appl. No.: 15/237,606

(22) Filed: Aug. 15, 2016

(65) Prior Publication Data

US 2016/0359452 A1 Dec. 8, 2016

Related U.S. Application Data

(63) Continuation-in-part of application No. 14/765,732, filed as application No. PCT/US2014/052418 on Aug. 22, 2014, now Pat. No. 9,419,236.

(60) Provisional application No. 61/868,761, filed on Aug. 22, 2013.

(51) Int. Cl.
*H01L 27/30* (2006.01)
*D03D 15/00* (2006.01)
*D03D 1/00* (2006.01)
*H01L 51/44* (2006.01)
*H01L 51/00* (2006.01)

(52) U.S. Cl.
CPC ........ *H01L 51/441* (2013.01); *H01L 51/0097* (2013.01); *Y02E 10/549* (2013.01)

(58) Field of Classification Search
CPC ............... H01L 51/445; H01L 51/0097; H01L 51/4253; H01L 51/44; H01L 51/0037; H01L 51/0047; H01L 25/0652; H01L 25/0657; H01L 27/156; H01L 27/304; H01L 31/035281; D03D 1/0076; D01D 15/0088; Y02E 10/549

See application file for complete search history.

(56) References Cited

PUBLICATIONS

Bedeloglu et al. "Development of Energy Generating Photovoltaic Textile Structures for Smart Applications", Fibers and Polymers 2010, vol. 11, No. 3, 378-383 (Year: 2010).*

* cited by examiner

*Primary Examiner* — Susan D Leong
(74) *Attorney, Agent, or Firm* — Caseiro Burke LLC; Chris A. Caseiro

(57) ABSTRACT

A solar textile formed of a weave of a first tape structure and a second tape structure. In one embodiment, the ratio of the number of the first tape structure to the second tape structure is three to one. The first tape structure includes a photovoltaic (PV) conversion layer and an electrically conductive substrate. The second tape structure includes a PV conversion layer, a first electrically conductive layer, a non-conducting insulation layer and a second electrically conductive layer. The first tape structure and the second tape structure are in contact with one another so that the electrically conductive substrate of the first tape structure is in contact with the PV conversion layer of the second tape structure.

16 Claims, 10 Drawing Sheets

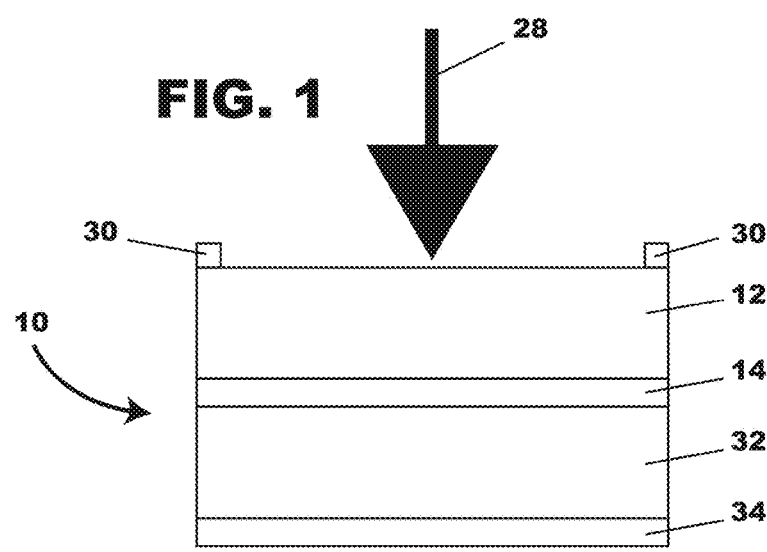
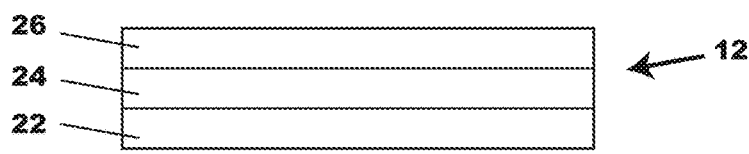
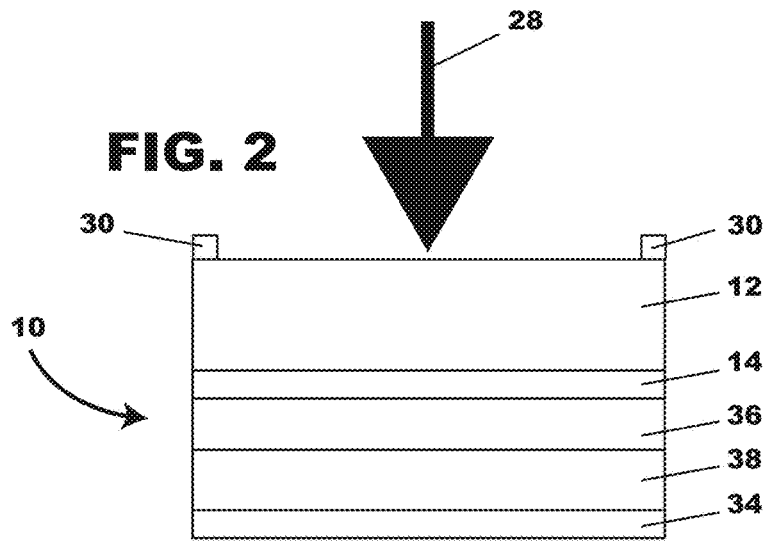

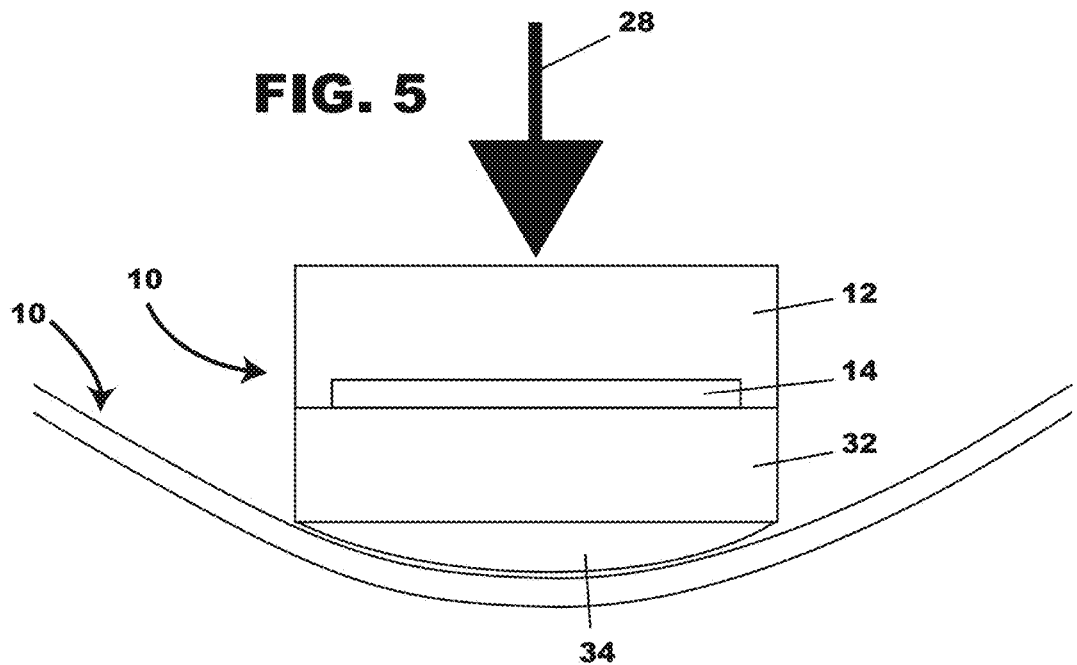
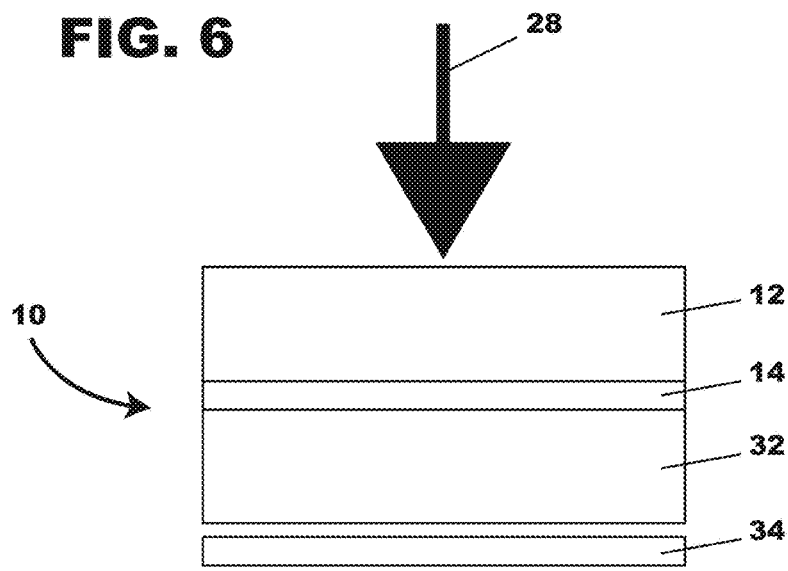

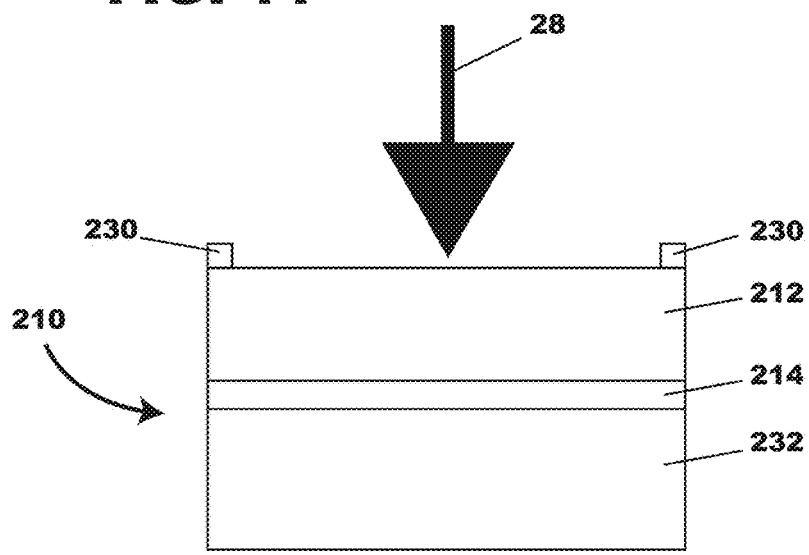
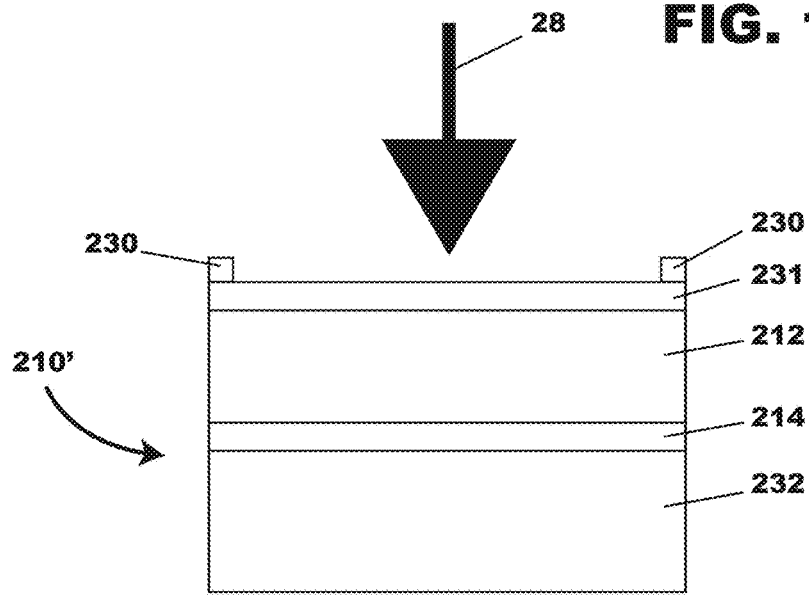

PHOTOVOLTAIC TEXTILES

BACKGROUND OF THE INVENTION

Field of the Invention

This invention relates to textiles designed for converting electrical charges, such as charges generated through solar energy, into usable electricity. More specifically the invention is directed to electrical charge transfer textiles, photovoltaic systems, solar textiles, and sub-components which reduce electrical resistance for improved performance.

Description of Related Art

Photovoltaic systems convert sunlight into electricity through the action of photovoltaic cells. Large solar arrays currently in use typically have numerous panels or modules, each with many photovoltaic cells. Such arrays have been made from rigid components. More recently, flexible photovoltaic components have been developed that may be incorporated into textiles as alternatives to rigid cells and modules.

Flexible solar energy technology such as polymer photovoltaics (PPV's) holds great promise for many applications. The freedom of movement provided by textiles has the potential for making solar energy conversion structures that are more easily transported and erected than comparable rigid solar structures. Such systems could be used to bring much needed electricity to remote or disaster ridden areas that would otherwise be without power. In other applications, efficient solar textiles integrated into common articles such as hats, garments, tents, and coverings could potentially provide electric power on a smaller scale.

Small cross-section photovoltaic fibers used for solar textile applications provide uniformity and fabric-like flexibility. Inexpensive and flexible polymer photovoltaics (PPVs) are well suited for use as fibers. However, attempts at producing efficient solar textiles from existing PPV components have been constrained by fundamental technical barriers relating to their inherent electrical resistance.

Present PPV fibers of coaxial construction rely on a centered inner conductor and a transparent external conductor, such as ITO (Indium Tin Oxide) or a conducting polymer such as PEDOT (Poly(3,4-ethylenedioxythiophene) poly(styrenesulfonate)), to move charge along the fiber. However, when such fibers are incorporated into a textile, the low electrical conductivity of the external, optically transparent electrode causes significant voltage drop in the available electricity. The voltage drop results because the transparent electrode provides two critical but contradictory functions. The first function is to pass solar flux unimpeded through the transparent electrode into the optically active photoelectric layers beneath the surface. The second function is to move or transport electric charge axially along the sheet dimension of the transparent electrode with minimum voltage drop or loss. Efficient optical transmission requires maximum optical clarity, implying a relatively thin electrode. However, efficient charge transport requires sufficient thickness to provide a low electrical resistance path. While one function optimizes with increasing thickness the other optimizes with decreasing thickness. Currently available optically transparent compounds, such as ITO and many of the new polymer-based substances such as PEDOT, do not simultaneously satisfy the optical clarity and electrical conductivity requirements. For PPV components made from these substances, acceptable optical transmission results in excessive electrical sheet resistance for use in solar textiles.

Other photovoltaic fiber designs rely on dual internal conductors throughout their length. However, the movement of power through textiles made from such fibers is generally more complicated and less reliable because of the need to make and maintain additional electrical connections with external circuitry. Furthermore, the small cross sectional dimension typical of internal conductors restricts charge flow. Similar to co-axial fibers, charge transport along the axis of dual internal conductor fibers yields large voltage drop, thereby diminishing the performance of textiles in which such fibers are used.

Attempts at producing photovoltaic (PV) fibers for textiles have reported power conversion efficiencies of only 0.01% with electrical fill factors of 24%. (*A Photovoltaic Fiber Design for Smart Textiles, Textile Research Journal*, Vol. 80(11): 1065-1074 DOI. It has also been reported that: "An n-type carrier counter electrode that is both highly conductive and optically transparent has not been reported. Even indium-tin oxide coatings with a resistivity as low as 10 ohm/cm2 cannot transport the photocurrent generated with 1 sun irradiance over more than 10 to 15 mm without incurring electrical losses." (*Solar Power Wires Based on Organic Photovoltaic Materials*, Science Magazine, 10 Apr. 2009.)

In addition to poor efficiency, solar textile modules made from photovoltaic fibers known in the art are subject to malfunction from shorting of conductors, particularly at connections where charges from multiple fibers are merged. Unless substantially fortified, the delicate nature of the small connections allows them to be damaged from minor impacts or abrasions. Depending on the design, a single short circuit could impair the function of multiple cells, or even adjacent solar modules. Similarly, solar textile modules made from other existing photovoltaic components such as thin films are either too fragile or rigid and are still largely unproven for exploiting the advantages of solar textiles.

A prior design developed and disclosed in PCT application serial number PCT/US2012/054866 provides a combination of components arranged to form a textile capable of generating electricity from solar energy. That prior design used a combination of highly conductive bus bars serving as conduits in contact with photovoltaic tapes or fibers to move charge in and out of textile unit cells. The bus bar conduits are arranged to minimize charge transport resistance throughout the textile by providing multiple, durable electrical contacts with charged surfaces along the length of the photovoltaic components. Unfortunately, the configurations of combinations of PV tapes and bus bar conduits woven together in an interlacing manner is inefficient in light of the present invention. Specifically, the PV tapes are overshadowed as a result of the over-and-under routing of the bus bar conduits as they pass over the top electrodes of the PV tapes. This limitation can result in shadowing of about 50% of the functional PV tape area. Textiles utilizing the prior design disclosed in the cited PCT application are also difficult to manufacture because they rely on multiple components, which increases the cost and complexity of fabrication and reduces the likelihood of widespread commercialization.

These and other technical problems relating to existing photovoltaic components and systems continue to inhibit the rapid commercialization of new applications for solar textiles. Therefore, there is a need in the art for more efficient photovoltaic textile components and materials in general, particularly those that are durable but still flexible enough to exhibit the properties of fabrics.

SUMMARY OF THE INVENTION

Accordingly, the present invention is directed to novel photovoltaic systems, components, and methods of manufacturing related to solar textiles. In general, the invention improves solar textile performance by taking a systems approach to the overall design. Textiles in accordance with the present invention employ integrated tape structures containing both the charge converting PV layer and conductive charge transport layers. The prior art system disclosed in regard to the PCT application referenced above comprises two distinct components, the PV tapes and the conductive bus bar conduits. The two were interwoven and so incapable of utilizing the entire surface area of the solar textile to collect solar energy. The present invention improves manufacturing options and substantially eliminates the shadowing limitation by integrating solar energy conversion and charge transport into a single tape structure. Specifically, the single tape structure comprises first and second electrically conductive layers sandwiched around an insulating substrate. The insulating substrate may be a unitary layer or it may be formed of a plurality of layers. A PV layer is applied on a top surface of the first electrically conducting layer. The PV layer may be a unitary layer or it may be formed of a plurality of layers. The PV layer provides the photovoltaic functionality while the second conductive layer performs as a low-resistance transport channel to permit low-loss charge movement along the axis of the tape. One or more conductive contacts may be positioned on an upper surface of the PV layer spaced from the first electrically conducting layer by the PV layer. This design overcomes the limitations previously described by permitting collection of solar energy across the entire surface area of the textile. In addition, by simultaneously providing the needed low-resistance path to move charge in and out of the textile weave, the single tape structure enables the formation of sufficiently efficient charge carrying textiles suitable for powering devices.

The single tape structure of the present invention can be used as both the warp and weft components and enables the formation of a solar textile without requiring a separate bus bar conduit. The tape structure of the present invention enables the fabrication of a textile from a weave of a plurality of such tape structures so that various circuit combinations are available and the output of those circuits is better than what is available when separate solar energy converting and charge transport components are used.

The present invention is a solar textile comprising a plurality of a first tape structure and one or more of a second tape structure, wherein the first tape structure includes a photovoltaic (PV) conversion layer and an electrically conductive substrate, wherein the second tape structure includes a PV conversion layer, a first electrically conductive layer, a non-conducting insulation layer and a second electrically conductive layer, and wherein at least one of the plurality of the first tape structure and at least one of the one or more of the second tape structure are in electrical contact with one another so that the electrically conductive substrate of at least one of the plurality of the first tape structure is in electrical contact with the PV conversion layer of the at least one of the one or more of the second tape structure. Each of the plurality of the first tape structure and/or one or more of the one or more of the second tape structure may include a sealant sublayer applied above its PV conversion layer. The PV conversion layer of the first tape structure and the second tape structure may be formed of an optically transparent hole transport sublayer that is above a photon absorbing photoactive sublayer that is above and an electron absorbing sublayer, wherein when the first and second tapes structures are exposed to light, the light is transmitted through the optically transparent hole transport sublayer and activates the photoactive sublayer. The optically transparent hole transport sublayer may be formed of PEDOT or other suitable material. The solar textile may also include a sealant sublayer located above the optically transparent hole transport sublayer. The sealant sublayer may be formed of IZO or other suitable material. The first tape structure may include an electrical interface layer between the PV conversion layer and the electrically conductive substrate of the first tape structure.

In an embodiment of the present invention, the solar textile is formed of a plurality of cells electrically coupled together, wherein each cell includes three first tape structures, wherein each of the three first tape structures includes a photovoltaic (PV) conversion layer and an electrically conductive substrate and one second tape structure, wherein the second tape structure includes a PV conversion layer, a first electrically conductive layer, a non-conducting insulation layer and a second electrically conductive layer. A first two of the three first tape structures may be positioned in parallel with one another and a third of the three first tape structures and the second tape structure are positioned in parallel with one another and perpendicular to the first two of the three first tape structures, and the second tape structure may be woven with the first two of the three first tape structures to pass under one of the first two first tape structures such that the PV conversion layer of the second tape structure comes in electrical contact with the conductive substrate layer of the one of the first two first tape structures and over the other of the first two first tape structures such that the second electrically conductive layer of the second tape structure comes in electrical contact with the PV conversion layer of the other of the first two first tape structures. The third of the three first tape structures may be woven with the first two of the three first tape structures to pass over the one of the first two first tape structures such that the conductive substrate layer of the third of the first tape structures comes in electrical contact with the PV conversion layer of the one of the first two first tape structures and under the other of the first two first tape structures such that the PV conversion layer of the third of the first three tape structures comes in electrical contact with the conductive substrate layer of the other of the first two first tape structures. For this particular embodiment, the PV conversion layers of the three first tape structures and the second tape structure are formed of an electron absorbing sublayer, a photon absorbing photoactive sublayer and an optically transparent hole transport sublayer, wherein the electron absorbing sublayer is above the electrically conductive substrate of the first tape structure and the electron absorbing layer is above the first electrically conducting layer of the second tape structure. The optically transparent hole transport sublayer may be formed of PEDOT or other suitable material. There may be a sealant sublayer located above the optically transparent hole transport sublayer, which sealant sublayer may be formed of IZO or other suitable material. There may be an electrical interface layer between the PV conversion layer and the electrically conductive substrate of the three first tape structures.

While the description of the present invention is directed to a tape structure that is suitable for use in a textile system that converts solar energy to electricity and the effective transport of that electricity, it is not limited strictly to "solar" textiles. Instead, it is directed to the inclusion of the tape structure in any textile that has one or more flexible and elongated charge carrying components, which may be photovoltaic components but that also may be other forms of charge carrying components, including, but not limited to, other forms of flexible conductive elements.

The foregoing and related aspects and embodiments and other advantages and features of the invention will be readily apparent to those skilled in the art after review of the following detailed description of the invention, drawings, and claims.

BRIEF DESCRIPTION OF THE DRAWINGS

FIG. 1 is a cross section of an integrated tape structure including a PV portion and two electrically conducting layers spaced from one another by an insulation layer. FIG. 1A is a cross section of the PV conversion layer of the integrated tape structure.

FIG. 2 is a cross section of the integrated tape structure of the present invention with the insulation layer comprised of a plurality of sublayers.

FIG. 5 is a cross section of an alternative embodiment of the tape structure showing a curved version of the second electrically conducting layer.

FIG. 6 is another alternative embodiment of the tape structure showing the second electrically conducting layer spaced from the insulation layer.

FIG. 11 is a cross section of a first tape structure of an embodiment of a solar textile of the present invention having a plurality of layers including a PV conversion layer.

FIG. 11A is a cross section of an alternative of the first tape structure with a protective layer over the PV conversion layer.

DETAILED DESCRIPTION OF THE INVENTION

Figure 3A:
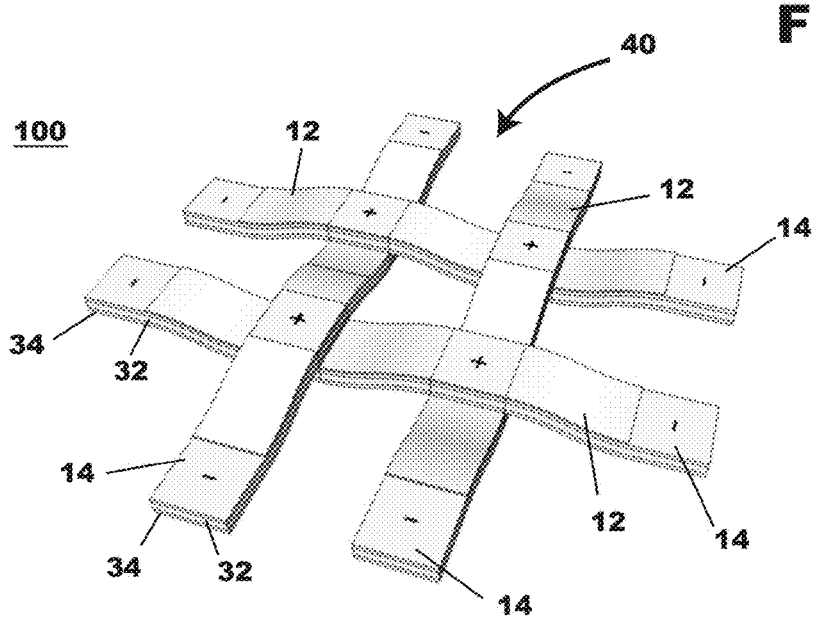
FIG. 3A is a top perspective view of a portion of a solar textile of the present invention formed with the integrated tape structure of FIG. 1

The term "deposit" covers all technologies used in coating a surface with a material including but not limited to spraying, dipping, spin coating, vacuum and chemical deposition, printing including, but not limited to, inkjet printing.

The term "light" includes a range of electromagnetic radiation known as visible light and portions of infrared and ultraviolet spectrums applicable to generating electricity from photovoltaic components.

The term "photovoltaic" means having a capacity to contribute to the production of electricity across opposite electrodes as a result of being exposed to electromagnetic radiation.

The abbreviation "PPV" is short for polymer photovoltaic and describes a component or system having photovoltaic function which includes a structural polymer and other materials.

The abbreviation "PV" is short for photovoltaic and describes a component or system having photovoltaic function, wherein the photovoltaic may not be a polymeric component.

The term "PV layer" refers to one or more photoactive layers that when combined with another will facilitate the generation and movement of electric charge.

The term "solar textile" includes textiles, cloths, fabrics, and other woven assemblies incorporating photovoltaic components and having varying degrees of flexibility.

The term "tape" refers to a relatively thin and narrow component with two opposing planar surfaces that is particularly longer than it is wide.

The term "transparent" means allowing light to pass through and includes translucent as well as transparent.

Photovoltaic systems according to the present invention comprise textiles made by weaving together integrated textile tape structures of the form described herein.

In preferred embodiments, systems of the present invention incorporate conductive tape structures of the configuration described herein. Shown in FIG. 1 is a cross section of an integrated single tape structure 10 of the present invention. The tape structure 10 includes a PV conversion layer 12 that may be a polymeric photovoltaic tape but is not limited to the inclusion of polymeric material in its fabrication. The PV conversion layer 12 contacts a first electrically conducting layer 14 that may be a structural support of the PV conversion layer 12. The first electrically conducting layer 14 is flexible and conductive and defines the active width of the PV conversion layer 12. The first electrically conductive layer 14 can be a metal, such as aluminum, a conductive polymer or a stack of layers of metal and conductive polymers chosen to achieve simultaneously, good electrical conductivity, mechanical strength and flexibility. As shown in FIG. 1A, the PV conversion layer 12 is fabricated of an electron absorbing sublayer 22 in contact with the first electrically conducting layer 14, a photon absorbing photoactive sublayer 24, and an optically transparent hole transport sublayer 26. The optically transparent hole transport sublayer 26 serves as an upper electrode of the tape structure 10. The first electrically conductive layer 14 and the PV conversion layer 12 are sequentially in physical and electrical contact with one another, forming the junction structure needed for photovoltaic conversion. In general, other structures may provide the photovoltaic conversion provided by the PV conversion layer 12 without deviating from the invention.

The optically transparent upper electrode 26 may be formed of ITO or PEDOT or any suitable optically transparent material having some conductivity. That is, the upper electrode 26 is fabricated of a material that is selected to allow light 28 representing solar energy to pass therethrough. The light 28 passes through the upper electrode 26 and reaches the photon absorbing photoactive layer 24, which enables movement of electrons to the electron absorbing layer 22. The photoactive layer 24 may be fabricated of P3HT:PCBM (poly-3-hexylthiophene and [6,6]-phenyl C61 butyric acid methylester blend). The electron absorbing layer 22 may be fabricated of Zinc Oxide. Those of skill in the art will recognize that other options for forming the indicated sublayers of the PV conversion layer 12 are possible. The PV conversion layer 12 may simultaneous overlay both the first electrically conducting layer 14 and a portion of the insulating substrate 32 in such a manner as to establish an insulating margin around the edges of the first electrically conducting layer 14 to ensure electrical separation between otherwise highly conductive layers of the tape structure 10 itself or highly conductive layers of adjacent tape structure layers used to form a solar textile. That optional configuration of the PV conversion layer 12 and the first electrically conducting layer 14 is shown in FIG. 5.

The photoactive and accompanying layers of materials that form the PV conversion layer 12 may be deposited on the first electrically conductive layer 14 and assembled together using present deposition methods known in the art. One or more contacts 30 may be affixed to an upper surface of the upper electrode 26 and may be used to establish an electrical connection to the upper electrode 26. Contacts 30 are made from a highly conductive material, such as the same material as the first electrically conducting layer 14.

The remainder of the tape structure 10 includes an insulation layer 32 and a second electrically conducting layer 34. The insulation layer 32 is fabricated of one or more materials selected to electrically insulate the second electrically conducting layer 34 from the first electrically conducting layer 14 of the tape structure 10. The insulation layer 32 may be fabricated as a unitary structure or it may be fabricated of two or more sublayers. For example, as shown in FIG. 2, the insulation layer 32 may be formed of a first insulation sublayer 36 and a second insulation sublayer 38. The first insulation sublayer 36 and the second insulation sublayer 38 may be formed of the same or different materials. They may be physically connected together so that they move in unison when the tape structure 10 moves or they may be allowed to move differently with respect to one another to enhance the flexibility of the tape structure 10 as part of a textile. The insulation layer 32 may be fabricated of a nonmetallic material such as polyester, polyimide, polyethylene terephthalate, for example, or other material having structural characteristics suitable for maintaining the structural integrity of the tape structure 10 when used for its intended purpose and that is also sufficiently electrically insulative so that no short occurs between the first electrically conducting layer 14 and the second electrically conducting layer 34.

The second electrically conducting layer 34 is formed of a material and with dimensions similar to that provided for the first electrically conducting layer 14. That is, it is flexible and conductive and may extend to the perimeter or be recessed at its perimeter with respect to its width versus the width of the insulation layer 32. It can be a metal, such as aluminum, for example, a conductive polymer or a stack of layers of metal and conductive polymers chosen to achieve simultaneously good electrical conductivity, mechanical strength and flexibility. The second electrically conducting layer 34 of one of the tape structures 10 is arranged to make electrical contact with the PV conversion layer 12 of an adjacent different one of the tape structures 10 when a plurality of the tape structures are combined such as by weaving into a textile. That is, the second electrically conducting layer 34 of one of the tape structures 10 has a potential substantially corresponding to that of the upper electrodes 26 of the PV conversion layer 12 of another one of the tape structures with which it makes contact. The first electrically conducting layer 14 in that instance has a lower potential than that of the second electrically conducting layer 34.

When finished, the tape structure 10 can be rolled for storage or shipment, for example, and then be unrolled and fed as needed into looms of various types to create numerous textile weaves.

Figure 3B:
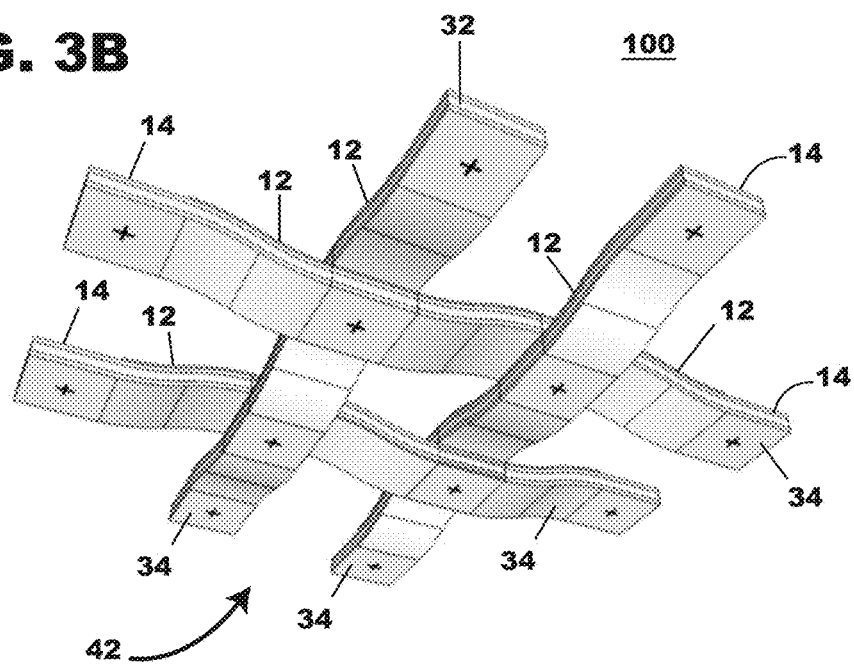
FIG. 3B is a bottom perspective view of the portion of the solar textile of FIG. 3A.

FIGS. 3A and 3B show an embodiment of a textile 100 of the present invention using a plurality of the tape structures 10 of FIG. 1 or FIG. 2 as an assembled weave whereby each of the plurality of tape structures 10 has the PV conversion layer 12 with one or more optional contacts 30 on an upper side 40 thereof and the second electrically conducting layer 34 on a bottom side 42 thereof. The first electrically conducting layer 14 lies between the PV conversion layer 12 and the insulation layer 32, while the second electrically conducting layer 34 is on the opposite side of the insulation layer 32, forming the bottom side 42 of the tape structure 10. The second electrically conducting layer 34 makes contact either with the contacts 30 or directly to the PV conversion layer 12. The contacts 30 are highly conductive and no significant voltage drop is expected along the length of the tape structure 10 when two tape structures 10 are put together.

Electrical termination with external circuitry may be accomplished by exposing ends 44 of the first electrically conducting layers 14. A bulk clamping system can also be used to establish the electrical connection to external circuitry. For example, since the tape structure 10 is of a uniform bipolar, bidirectional nature, a simple bipolar, mechanical compression clamp may be used to make electrical connections to complete an electrical circuit. When the connections are made, electrical current travels in a circuit from the terminal established at the interface between the PV conversion layer 12, or the contacts 30 if present, and the second electrically conducting layer 34 of separate cross-woven tape structures 10 and returns through the relatively lower potential terminal established at the ends 44 of the first electrically conducting layer 14.

Figure 4:
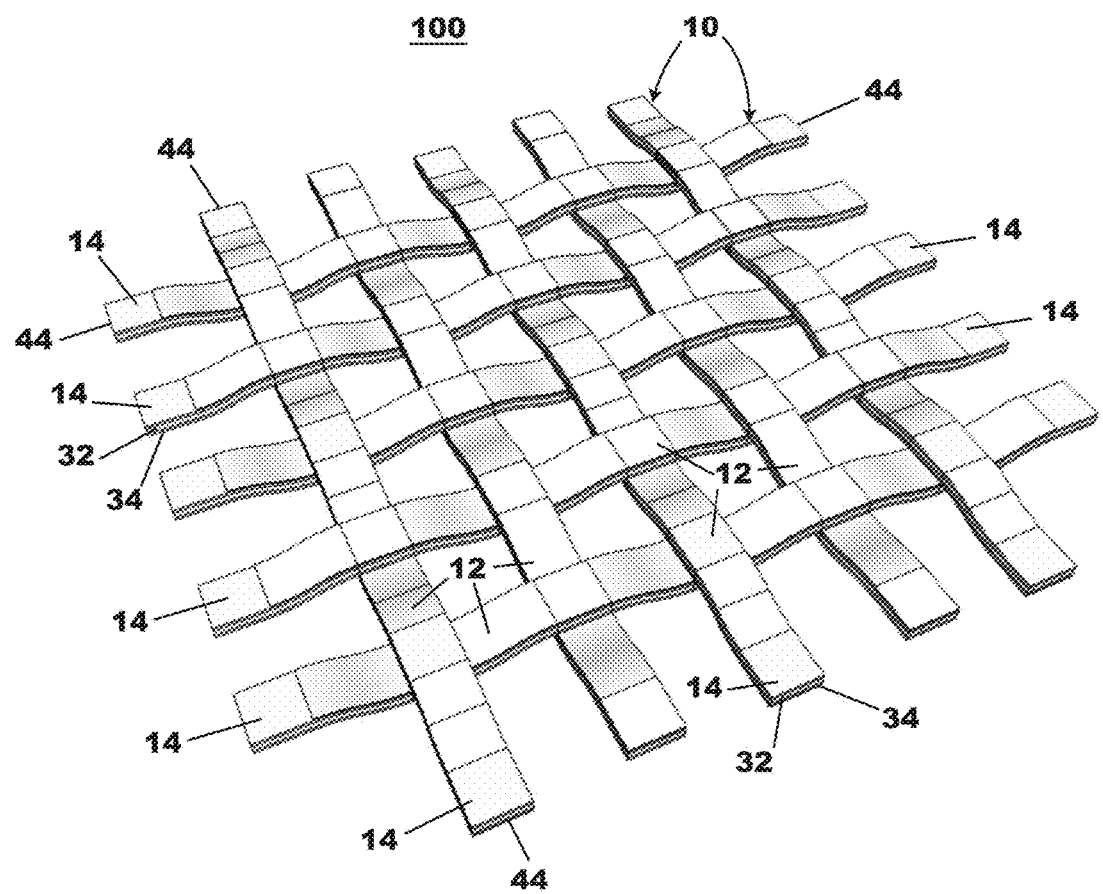
FIG. 4 is a perspective view of the solar textile of the present invention formed with the integrated tape structure of FIG. 1 with terminations at both tape ends.

The textile incorporating the tape structure 10 of FIGS. 1 and 2 can be scaled to larger sizes as shown in FIG. 4. Note that the electrical terminations are bulk macroscopic terminations without the need to separate individual polarities since the tops of the tape structures 10 are always one polarity and the intermediate sections of the tape structures 10 at the ends 44 of the first electrically conducting layer 14 are effectively the other polarity. Additionally, FIG. 4 shows that terminations can be made at both ends 44 of the tape structures 10, which should minimize voltage drop. It is also evident from these figures that this tape structure configuration eliminates the shadowing limitation evident with the prior design since all exposed surfaces of the textile are photoactive. This configuration is also easier to manufacture than prior designs requiring the use of two separate structures, one for converting solar energy and the other for transporting the converted electrical signals.

An alternative embodiment of the tape structure 10 is represented in FIG. 5. In this embodiment, the second electrically conducting layer 34 is curved or arched to enable its conformance with an underlying adjacent tape structure 10 that is curved as a result of its flexibility and any movement of the manufactured textile including the tape structure 10. This serves multiple purposes: 1) the curved surface approximately matches the curvature of the under arching tape, thereby increasing the effective contact area between the tapes, and 2) contact pressure is more uniformly distributed over the area of contact. The result is a more uniform and controlled electrical interface between the over and under arching tapes.

Figure 7:
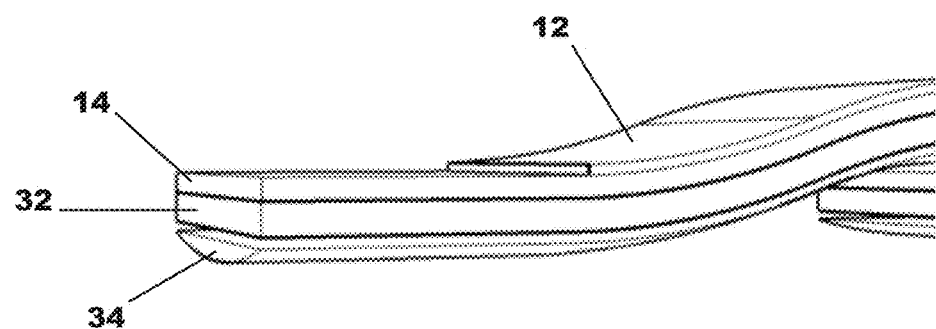
FIG. 7 is cross section side view of the embodiment of the tape structure of FIG. 6.
Figure 8:
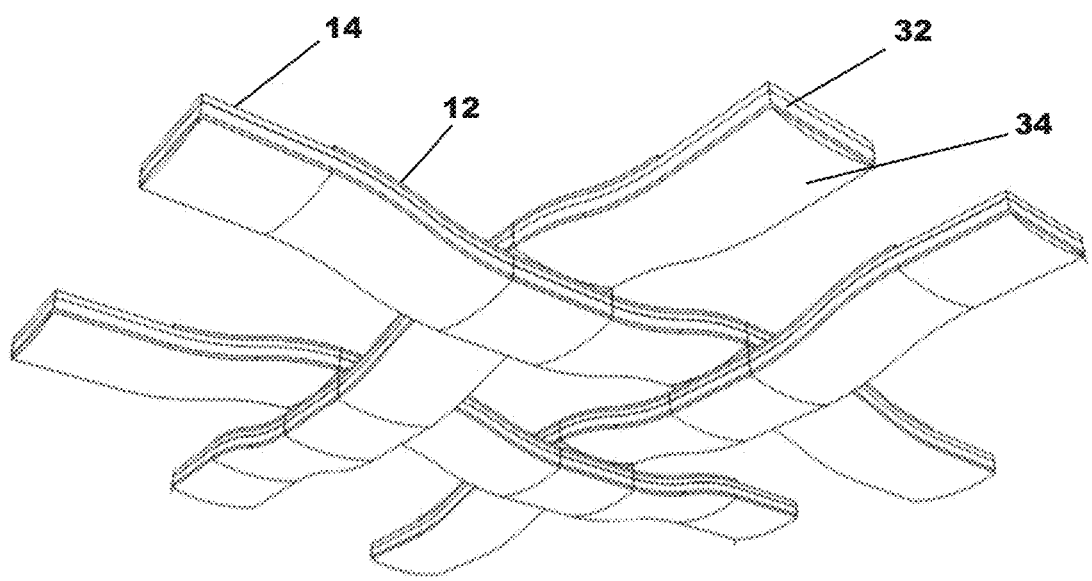
FIG. 8 is a bottom perspective view of a textile including the tape structure configuration of FIG. 6.

FIG. 6 illustrates a design alternative that maintains the desirable electrical properties of the two metal electrodes while minimizing the impact on tape stiffness. This is accomplished by separating the second electrically conducting layer 34 from the insulation layer 32, albeit with some physical connection maintained, thereby enabling mechanical shear to occur between the layers. This eliminates I-beam behavior and reduces layer stress arising from tape flexure. FIG. 7 shows the same separated design shown in FIG. 6 but with a curved cross section of the second electrically conducting layer 34. Other cross section designs are also possible. FIG. 8 shows the bottom curved electrode that is the second electrically conducting layer 34 as it would be implemented in a weave.

Figure 9:
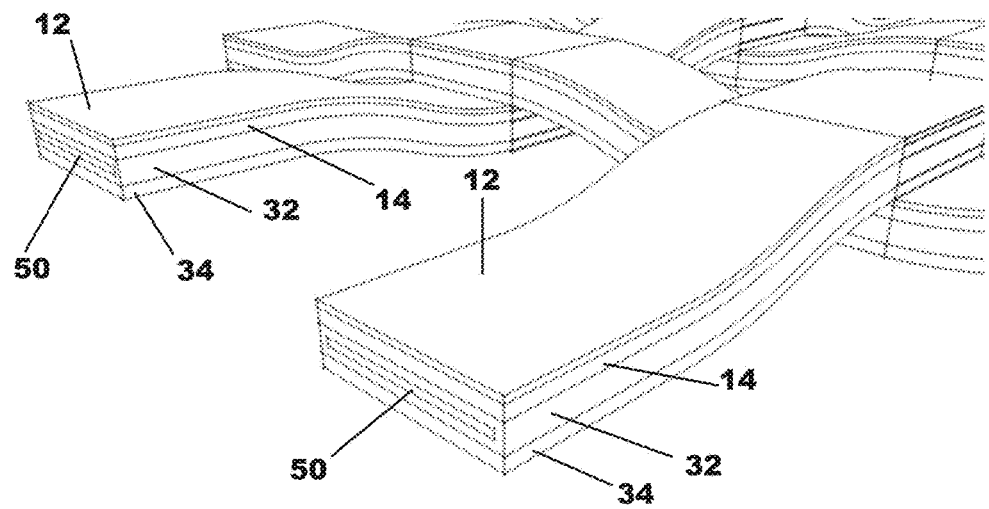
FIG. 9 is a top perspective view of an embodiment of a textile including the tape structure of the present invention including a way to increase contact between adjacent tapes.
Figure 10:
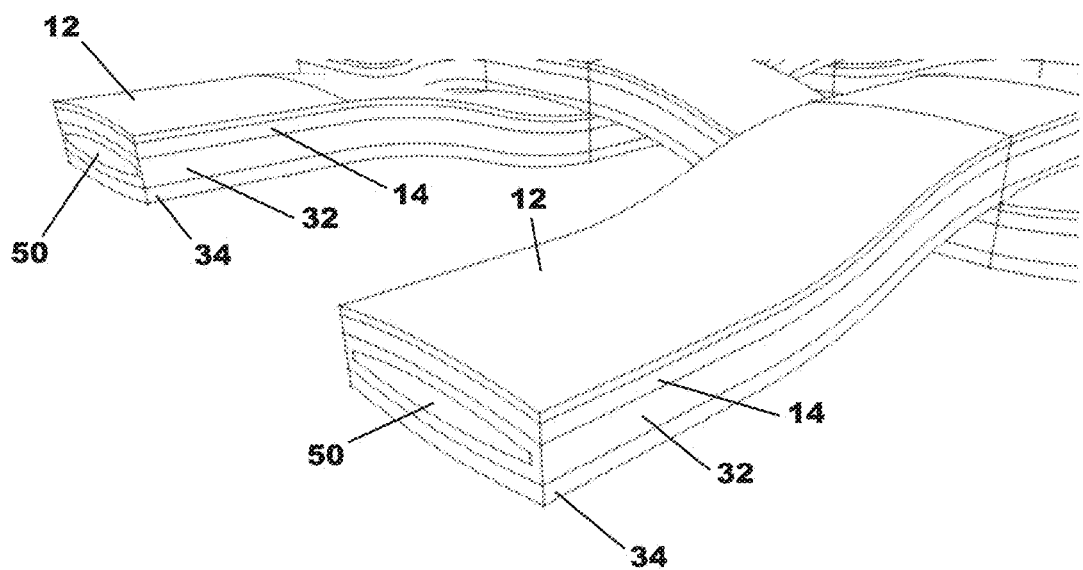
FIG. 10 is a top perspective view of the textile of FIG. 9 showing internal expansion within the tape structure to enhance contact between adjacent tapes.

An aspect of achieving desired good tape-to-tape electrical contact in a textile comprising a plurality of the tape structures 10 combined together is to force the tapes to establish more surface area contact with one another. An applied force packs the adjoining tapes closer together, and through tape flexure, increases contact pressure between the over and under arching tapes arising from the tighter radius of curvature of the tapes that can be established. It is also possible to increase tape-to-tape contact pressure by expanding the tape cross section. FIG. 9 shows a simple rectangular cross section tape arranged to include an expansion element 50 in an unexpanded configuration. FIG. 10 shows the same tape of FIG. 9 but with the expansion element 50 in an expanded configuration. The expanded form of the expansion element 50 causes the tape to take on a convex shape so that adjacent tapes that are so expanded will have greater contact between their respective second electrically conducting layers 34 and PV conversion layers 12. One example of a way to provide the expansion element 50 is to form a pouch within or adjacent to the insulation layer 32 and insert a fluid to expand the pouch. Another way is to form a portion, as shown in FIGS. 9 and 10, of the insulation layer 32 of an expandable material, such as an expandable temperature-active foam and apply fluid pressure to the foam. The insulation layer 32 may also be fabricated of such a material and thereby become the expansion element 50.

Embodiments of the tape structure 10 for textiles described thus far are only examples of the many that may be constructed according to the present invention. Textiles having other weaves attaining functional objectives of the present invention are possible using the same PV conversion layer 12, first electrically conducting layer 14, insulation layer 32 and second electrically conducting layer 34. Moreover, a multitude of textile products are made possible by varying the geometric structures of the tape structures 10 as well as their orientations with respect to one another.

Figure 12:
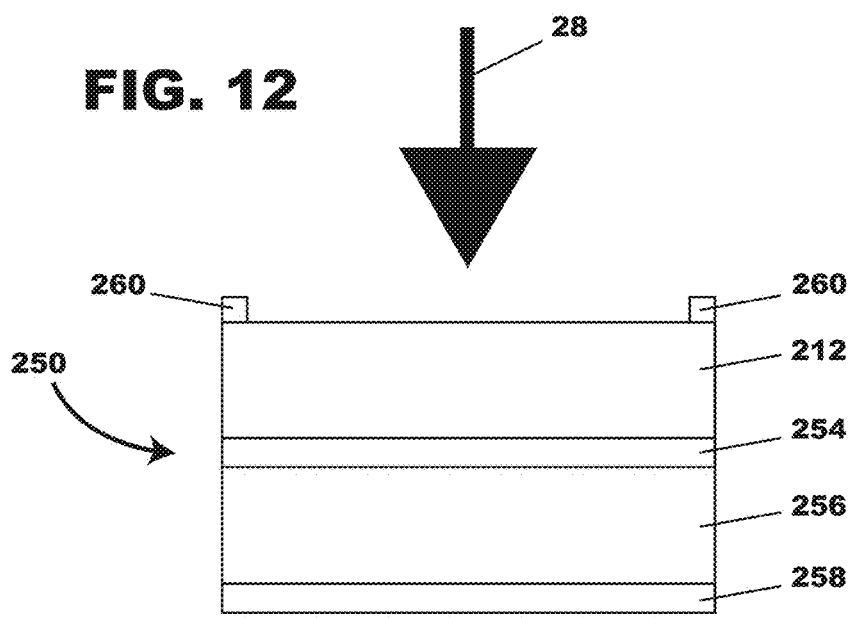
FIG. 12 is a cross section of a second tape structure that may be combined with the first tape structure of FIG. 11 to form a solar textile with the second tape structure having a plurality of layers including a PV conversion layer.
Figure 12A:
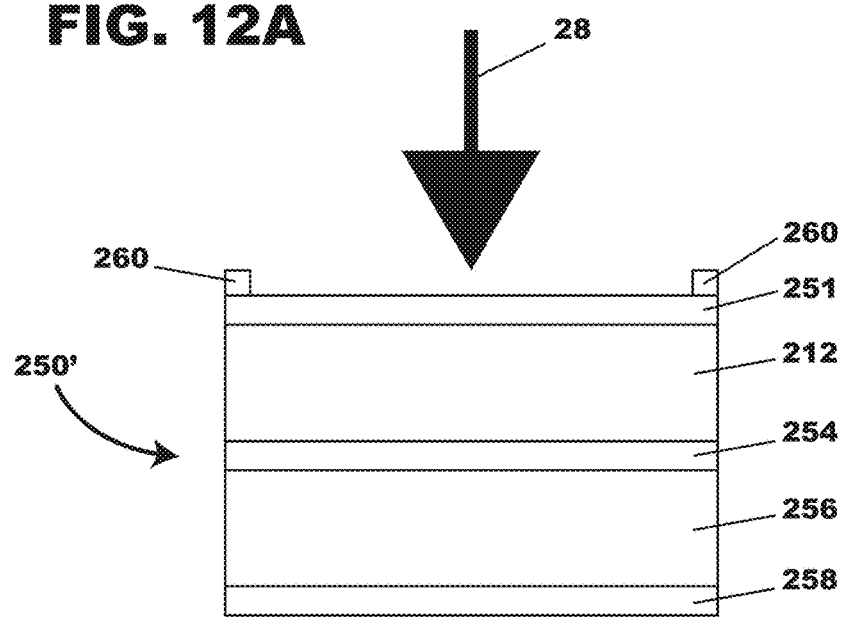
FIG. 12A is a cross section of an alternative of the second tape structure with a protective layer over the PV conversion layer.
Figure 14:
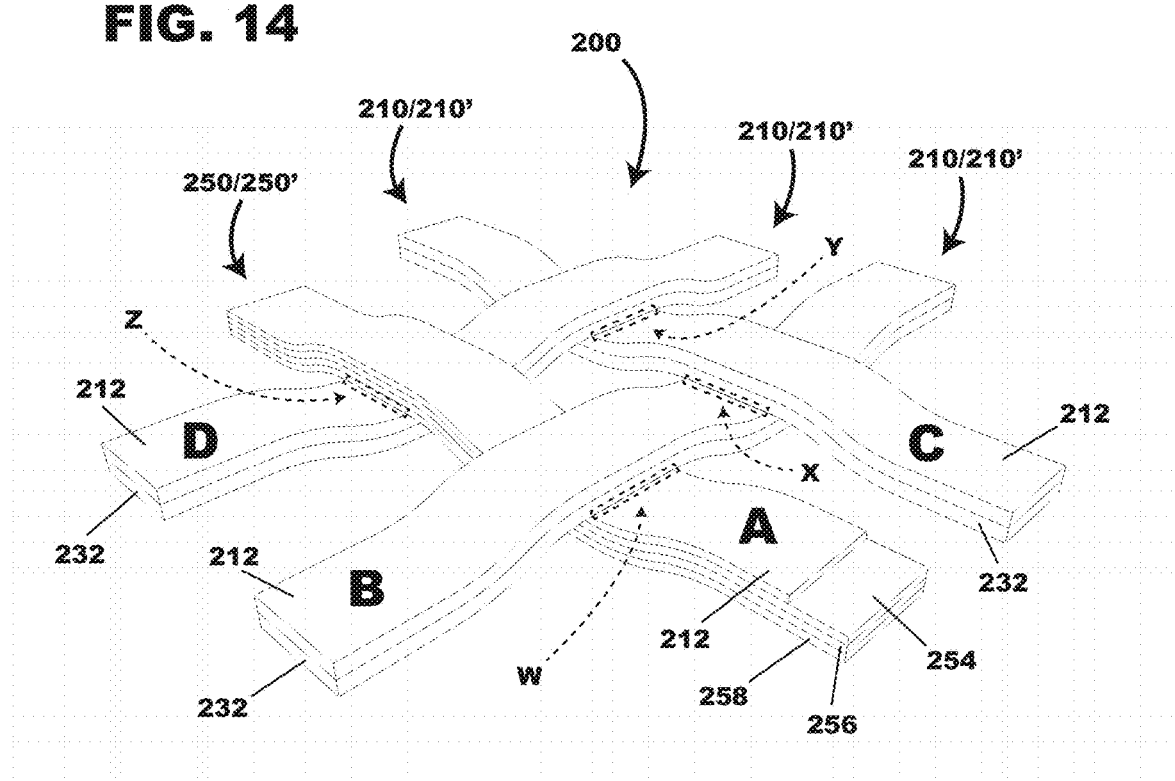
FIG. 14 is a perspective view of an example portion of an embodiment of a solar textile of the present invention formed by combining a plurality of the first tape structure of FIGS. 11-11A with the second tape structure of FIGS. 12-12A.

For example, FIG. 14 illustrates an embodiment of a solar textile 200 comprising a plurality of a first tape structure 210 of FIG. 11 or first tape structure 210' of FIG. 11A combined with either a second tape structure 250 of FIG. 12 or a second tape structure 250' of FIG. 12A. The combination of tape structures shown in FIG. 14 defines a "cell," wherein a plurality of cells may be created as a function of the number of weaves of tape structures used to make a fabric of the solar textile. For purposes of this description, a cell is established by the combination of contact sites at the interfaces of different tapes. Any combination of these tape structure configurations reduces the total amount of metal within the solar textile 200 as compared to other solar textiles described herein. Further, altering the ratio of first tape structures to second tape structures provides options regarding the number of electrical series connections within the solar textile 200, which series connections provide the added benefit of increased voltage within the textile.

The first tape structure 210 includes an electrically conductive substrate layer 232 and a PV conversion layer 212 oriented as shown in FIG. 11 wherein the PV conversion layer 212 is above the electrically conductive substrate layer 232 in relation to the direction from which the sunlight 28 makes contact with the first tape structure 210. Optionally, the first tape structure may include electrical contacts 230. The electrically conducting substrate layer 232 and the PV conversion layer 212 are in electrical contact with one another, forming the junction structure needed for photovoltaic conversion. That electrical contact may be direct or there may be an optional electrical interface layer 214 established therebetween. The transfer of electrons from the PV conversion layer 212 to the substrate layer 232 is enhanced when an optional electrical interface layer 214 is applied between the PV conversion layer 212 and the substrate layer 232. The interface layer 214 may be formed of a metallic material or a non-metallic but conductive material selected to achieve the desired flexibility of the solar textile 200. The interface layer 214 may be formed from any material or sandwich of materials known in the art. For example, titanium dioxide is one such well-known material that can serve as the interface layer.

An alternative version of the first tape structure 210 is shown in FIG. 11A, in which first tape structure 210' further includes, in addition to layers 212 and 232, optional layer 214 and optional contacts 230 of first tape structure 210, an optional optically transparent sealant sublayer 231 that may be applied over the PV conversion layer 212 to protect it from premature degradation over time. The layers are oriented as shown in FIG. 11A wherein the optional optically transparent sealant sublayer 231 is above the PV conversion layer 212, the PV conversion layer 212 is above the optional electrical interface layer 214, which is above the electrically conductive substrate layer 232 in relation to the direction from which the sunlight 28 makes contact with the first tape structure 210'. The sealant sublayer 231 is electrically conductive and optically transparent and may be fabricated of any material having these characteristics. For example, the sealant sublayer may be ITO, IZO or any other optically transparent material that provides the requisite protection of the PV conversion layer 212 from environmental degradation.

The second tape structure 250 includes PV conversion layer 212, a first electrically conducting layer 254, a non-conducting insulation layer 256, a second electrically conducting layer 258 and optionally includes electrical contacts 260. The layers are oriented as shown in FIG. 12 wherein the PV conversion layer 212 is above the first electrically conducting layer 254, which is above the non-conducting insulation layer 256, which is above the second electrically conducting layer 258 in relation to the direction from which the sunlight 28 makes contact with the second tape structure 250. The PV conversion layer 212 and the first electrically conducting layer 254 are sequentially in physical and electrical contact with one another, forming the junction structure needed for photovoltaic conversion. The first electrically conducting layer 254 which corresponds in function and configuration to the first electrically conducting layer 14 previously described herein. The insulation layer 256 is fabricated of one or more materials selected to electrically insulate the second electrically conducting layer 258 from the first electrically conducting layer 254 of the tape structure 250. The insulation layer 256 may be fabricated as a unitary structure or it may be fabricated of two or more sublayers and corresponds in function and configuration to the insulation layer 32 previously described. The second electrically conducting layer 258 is arranged to make electrical contact with the PV conversion layer of an adjacent tape structure; for example, it is in contact with tape structure D in the solar textile 200 of FIG. 14. The second electrically conducting layer 258 corresponds in function and configuration to the second electrically conducting layer 34 previously described herein.

An alternative version of the second tape structure 250 is shown in FIG. 12A, in which second tape structure 250' further includes in addition to layers 212, 254, 256 and 258 and optional contacts 260, an optional optically transparent sealant sublayer 251 that may be applied over the PV conversion layer 212 to protect it from premature degradation over time. The layers are oriented as shown in FIG. 12A wherein the optional optically transparent sealant sublayer 251 is above the PV conversion layer 212, which is above the first electrically conducting layer 254, which is above the non-conducting insulation layer 256, which is above the second electrically conducting layer 258 in relation to the direction from which the sunlight 28 makes contact with the second tape structure 250'. The sealant sublayer 251 is electrically conductive and optically transparent and may be fabricated of any material having these characteristics. For example, the sealant sublayer may be ITO, IZO or any other optically transparent material that provides the requisite protection of the PV conversion layer 212 from environmental degradation.

Figure 13:
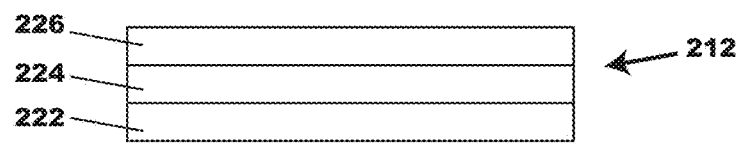
FIG. 13 is a cross section of the PV conversion layer of the first tape structure of FIGS. 11-12A.

As shown in FIG. 13, the PV conversion layer 212 of the first tape structure 210/210' or of the second tape structure 250/250' is fabricated of an electron absorbing sublayer 222 arranged for electrical contact with the electrically conducting substrate layer 232 of the first tape structure 210/210' or the first electrically conducting layer 254 of the second tape structure 250/250', a photon absorbing photoactive sublayer 224 and an optically transparent hole transport sublayer 226. The optional optically transparent sealant sublayer 231/251 may be applied above the hole transport sublayer 226 in either or both of first tape structure 210' and second tape structure 250' to protect the hole transport sublayer 226 from premature degradation over time. When the sealant sublayer 231/251 is used for either or both of the tape structures, the sealant sublayer 231/251 forms an upper electrode for the first tape structure 210' and/or an upper electrode for the second tape structure 250'. Alternatively, if the sealant sublayer 231/251 is not used for either or both of the tape structures, the hole transport sublayer 226 alone is the upper electrode of the first tape structure 210 and/or an upper electrode of the second tape structure 250.

The upper electrode for either or both of the first and second tape structures, whether formed of the hole transport sublayer 226 alone or the sealant sublayer 231/251, is fabricated of a material that is selected to allow light 28 representing solar energy to pass therethrough. The light 28 passes through the upper electrode and reaches the photon absorbing photoactive layer 224, which enables movement of electrons to the electron absorbing layer 222. The photoactive layer 224 may be fabricated of P3HT:PCBM (poly-3-hexylthiophene and [6,6]-phenyl C61 butyric acid methylester blend) or any other solar conversion technology known in the art and possessing the mechanical properties necessary for inclusion in a woven textile. The electron absorbing layer 222 may be fabricated of Zinc Oxide. Those of skill in the art will recognize that other options for forming the indicated sublayers of the PV conversion layer 212 are possible.

In a manner similar to the optional configuration disclosed in connection with FIG. 5, the PV conversion layer 212 in the second tape structure 250/250' may simultaneously overlay both the first electrically conducting layer 254 and a portion of the insulating substrate 256 in such a manner as to establish an insulating margin around the edges of the first electrically conducting layer 254 to ensure electrical separation between otherwise highly conductive layers of the tape structure 250/250' itself or highly conductive layers of adjacent tape structure layers used to form a solar textile.

The solar textile 200 of FIG. 14 includes a combination of one tape of the second tape structure 250/250' and three tapes of the first tape structure 210/210'. For purposes of describing the electrical output generated by a textile weave such as that depicted in FIG. 14, the second tape structure 250/250' is referred to as tape A and the three first tape structures 210/210' are referred to as tapes B, C and D. Whereas the second tape structure 250/250' includes insulation layer 256, it will not generate a short when contacted with conductive surfaces of other tapes, such as the first tape structures 210/210', which are formed to include conductive substrate layer 232. This approach has physical advantages such as reduced weight, greater flexibility and drapability, and electrical advantages such as an increase in voltage achieved from generating series connections within the solar textile 200. The woven tape combination represented in FIG. 14 has a ratio of one second tape structure to three first tape structures as a way to take advantage of the high conductivity of the second tape structure and the more flexible configuration of the first tape structure. Other ratios of first tape structures and second tape structures are possible, with that ratio selection based upon particular electrical and structural characteristics of interest for the textile.

The second tape structure 250/250' in this arrangement functions as the primary charge carrier to the edge of the solar textile 200 due to the low resistance of conductive layers 254 and 258 and the existence of the insulation layer 256 between conductive layers 254 and 258. In contrast, the first tape structures 210/210' need only function as charge carriers within the cell due to the limited distance before charges can be transferred to the highly conductive layers of the second tape structure 250/250' for transport outside the cell. This design allows the use of more flexible conductive materials in the first tape structure 210/210' without significant loss due to resistances that are higher than metal. In addition, because each individual tape structure is electrically independent, incorporation of a conductive substrate 232 creates an opportunity to make series connections within the cell by placing the tapes in physical and electrical contact with each other as shown in FIG. 14. It can be seen by extrapolation that placing a plurality of second tape structures 250/250' in combination with a plurality of first tape structures 210/210' that charges will move along the path of least resistance and so the potential can differ from contact site to contact site dependent on the number of charges located at those sites. Termination can also be simplified over a textile woven completely from the tape structure of FIG. 5 because the series connections made within the textile result in only one circuit being presented at the textile edge.

Figure 15:
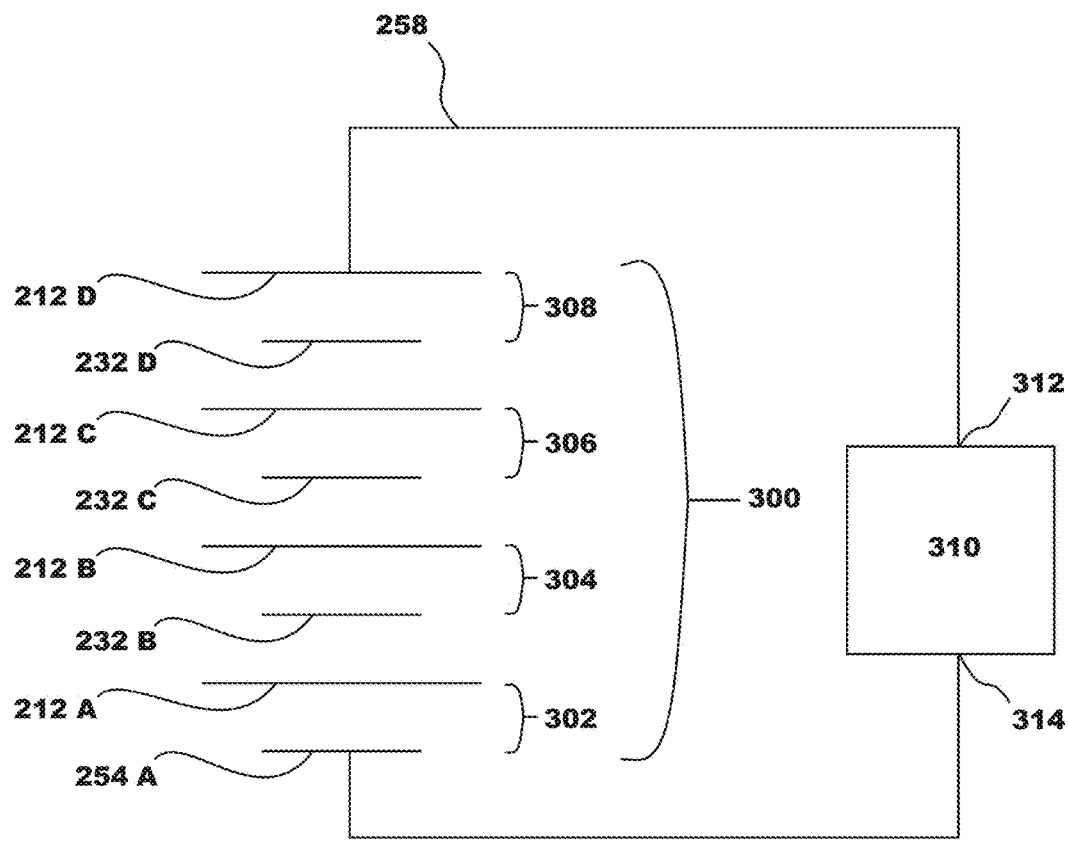
FIG. 15 is a diagrammatic representation of a battery formed by the solar textile configuration of FIG. 14 coupled to a load.

The combination of tape structures shown in FIG. 14 establishes a battery 300 represented in FIG. 15 coupled to a load 310. With reference to FIGS. 14 and 15, contact interfaces between tapes occur at W (between tapes A and B), X (between tapes B and C), Y (between tapes C and D) and Z (between tapes D and A). It will be understood by one of skill in the art that each of the interfaces W, X, Y, Z occur over the entire contact surface of the relevant tapes and that the dashed sections depicted in FIG. 15 illustrate only the edge of the interface. Each tape functions similar to a battery cell when exposed to the sunlight 28. As all of the tapes are electrically coupled together serially, the combination of battery cells 302-308 produces battery 300 having a potential that is the sum of the potentials of the individual battery cells 302-308 formed by the individual tapes. For battery cell 302, layer 254 of tape A is the equivalent of a negative terminal and layer 212 of tape A is the equivalent of a positive terminal. For battery cell 304, layer 232 of tape B is the equivalent of a negative terminal and layer 212 of tape B is the equivalent of a positive terminal. For battery cell 306, layer 232 of tape C is the equivalent of a negative terminal and layer 212 of tape C is the equivalent of a positive terminal. For battery cell 308, layer 232 of tape D is the equivalent of a negative terminal and layer 212 of tape D is the equivalent of a positive terminal. Layer 254 of tape A is the negative terminal of the battery 300 that may be coupled directly or indirectly to lower potential node 314 of the load 310. Layer 212 of tape D is the positive terminal of the battery 300, which can be coupled directly or indirectly to higher potential node 312 of the load through layer 258 of tape A, which functions as a conductor.

Those of skill in the art will recognize that the solar textile 200 of FIG. 14 is a representation of what is possible by combining the first tape structure 210/210' with the second tape structure 250/250'. The second tape structure 250/250' may extend the length of a fabric to be coupled to the load 310; for example, more than four battery cells may be used to establish a battery such as battery 300 using more of the first tape structures 210/210' coupled to the second tape structure 250/250'. Further, more second tape structures 250/250' may be used in parallel to create battery equivalents in parallel. In addition, different power supply circuits may be established using the first tape structures 210/210' and the second tape structures 250/250' in various selectable ways as a function of the requirements for the material used to produce power.

As described herein, persons skilled in the art will understand that novel systems, components, and methods for fabricating improved solar textiles are herein disclosed which resolve significant shortcomings in the prior art. The embodiments provided are intended only as exemplary illustrations and not for the purpose of limiting the scope of claims which might be sought to the present invention. Various changes, modification, and equivalents in addition to those shown or described will become apparent to those skilled in the art and are similarly intended to fall within the spirit and scope of the invention whether or not they presently exist in the following or are later made in amended claims.

What is claimed is:

1. A solar textile comprising a plurality of a first tape structure and one or more of a second tape structure, wherein the first tape structure includes a photovoltaic (PV) conversion layer and an electrically conductive substrate, wherein the second tape structure includes a PV conversion layer, a first electrically conductive layer, a non-conducting insulation layer and a second electrically conductive layer, and wherein at least one of the plurality of the first tape structure and at least one of the one or more of the second tape structure are in electrical contact with one another so that the electrically conductive substrate of at least one of the plurality of the first tape structure is in electrical contact with the PV conversion layer of the at least one of the one or more of the second tape structure.

2. The solar textile of claim 1 wherein each of the plurality of the first tape structure and each of the one or more of the second tape structure has a sealant sublayer applied above its PV conversion layer.

3. The solar textile of claim 1 wherein the ratio of the number of the plurality of the first tape structure to the number of the one or more of the second tape structure is three to one.

4. The solar textile of claim 1 wherein the ratio of the number of the plurality of the first tape structure to the number of the one or more of the second tape structure is one to one.

5. The solar textile of claim 3 comprising a plurality of cells, wherein at least one cell of the plurality of cells include two of the first tape structures which are positioned perpendicular to one second tape structure and a third first tape structure and wherein each of the plurality of first tape structures and the second tape structure are in electrical contact.

6. The solar textile of claim 1 wherein the PV conversion layer of the first tape structure and the second tape structure are formed of an optically transparent hole transport sublayer that is above a photon absorbing photoactive sublayer that is above and an electron absorbing sublayer, wherein when the first and second tapes structures are exposed to light, the light is transmitted through the optically transparent hole transport sublayer and activates the photoactive sublayer.

7. The solar textile of claim 6 wherein the optically transparent hole transport sublayer is formed of PEDOT.

8. The solar textile of claim 6 further comprising a sealant sublayer located above the optically transparent hole transport sublayer.

9. The solar textile of claim 8 wherein the sealant sublayer is formed of IZO.

10. The solar textile of claim 1 further comprising an electrical interface layer between the PV conversion layer and the electrically conductive substrate of the first tape structure.

11. A solar textile comprising a plurality of cells electrically coupled together, wherein each cell includes:
three first tape structures, wherein each of the three first tape structures includes a photovoltaic (PV) conversion layer and an electrically conductive substrate,
one second tape structure, wherein the second tape structure includes a PV conversion layer, a first electrically conductive layer, a non-conducting insulation layer and a second electrically conductive layer,
wherein a first two of the three first tape structures are positioned in parallel with one another and a third of the three first tape structures and the second tape structure are positioned in parallel with one another and perpendicular to the first two of the three first tape structures, and
wherein the second tape structure is woven with the first two of the three first tape structures to pass under one of the first two first tape structures such that the PV conversion layer of the second tape structure comes in electrical contact with the conductive substrate layer of the one of the first two first tape structures and over the other of the first two first tape structures such that the second electrically conductive layer of the second tape structure comes in electrical contact with the PV conversion layer of the other of the first two first tape structures, and wherein the third of the three first tape structures is woven with the first two of the three first tape structures to pass over the one of the first two first tape structures such that the conductive substrate layer of the third of the first tape structures comes in electrical contact with the PV conversion layer of the one of the first two first tape structures and under the other of the first two first tape structures such that the PV conversion layer of the third of the three first tape structures comes in electrical contact with the conductive substrate layer of the other of the first two first tape structures.

12. The solar textile of claim 11 wherein the PV conversion layers of the three first tape structures and the second tape structure are formed of an electron absorbing sublayer, a photon absorbing photoactive sublayer and an optically transparent hole transport sublayer, wherein the electron absorbing sublayer is above the electrically conductive substrate of the first tape structure and the electron absorbing layer is above the first electrically conducting layer of the second tape structure.

13. The solar textile of claim 12 wherein the optically transparent hole transport sublayer is formed of PEDOT.

14. The solar textile of claim 12 further comprising a sealant sublayer located above the optically transparent hole transport sublayer.

15. The solar textile of claim 14 wherein the sealant sublayer is formed of IZO.

16. The solar textile of claim 11 further comprising an electrical interface layer between the PV conversion layer and the electrically conductive substrate of the three first tape structures.

* * * * *